(12) United States Patent
Lin et al.

(10) Patent No.: US 7,717,587 B2
(45) Date of Patent: May 18, 2010

(54) LIGHT SOURCE DEVICE

(75) Inventors: Jian-Shian Lin, Hsinchu Hsien (TW); Chieh-Lung Lai, Hsinchu Hsien (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 160 days.

(21) Appl. No.: 11/964,627

(22) Filed: Dec. 26, 2007

(65) Prior Publication Data

US 2009/0135599 A1 May 28, 2009

(30) Foreign Application Priority Data

Nov. 28, 2007 (TW) ................ 96145081 A

(51) Int. Cl.
*F21V 21/00* (2006.01)
(52) U.S. Cl. .............. 362/249.06; 362/249.02; 362/631
(58) Field of Classification Search ............ 362/279.02, 362/227, 231, 233, 249.06, 249.01, 631
See application file for complete search history.

(56) References Cited

U.S. PATENT DOCUMENTS

| | | | |
|---|---|---|---|
| 5,519,596 A * | 5/1996 | Woolverton | 362/249.01 |
| 5,838,247 A | 11/1998 | Bladowski | |
| 6,244,728 B1 * | 6/2001 | Cote et al. | 362/249.06 |
| 6,299,337 B1 * | 10/2001 | Bachl et al. | 362/545 |
| 2006/0139933 A1 | 6/2006 | Lin et al. | |
| 2006/0232976 A1 | 10/2006 | Lin et al. | |

FOREIGN PATENT DOCUMENTS

CN 1512601 A 7/2004

OTHER PUBLICATIONS

English Abstract of CN1512601A.
Chinese Office Action dated Oct. 9, 2009 that references US6244728 and CN1512601A.

* cited by examiner

*Primary Examiner*—John A Ward
(74) *Attorney, Agent, or Firm*—WPAT, P.C.; Anthony King

(57) ABSTRACT

A light source device is disclosed, which involves forming a plurality of carrier planes on a substrate with at least one of the carrier planes forming an angle relative to the substrate, and respectively mounting LEDs on the carrier planes and electrically connecting the LEDs with the carrier planes so as to obtain a preferred light distribution effect, thereby eliminating the need of additional light control element in the prior art and enhancing light emitting efficiency of the light source device.

13 Claims, 5 Drawing Sheets

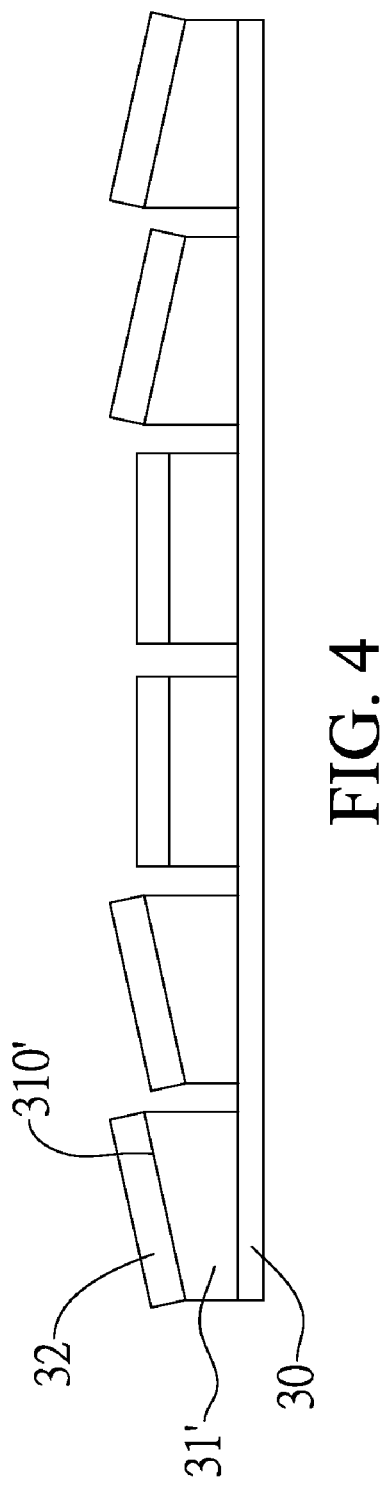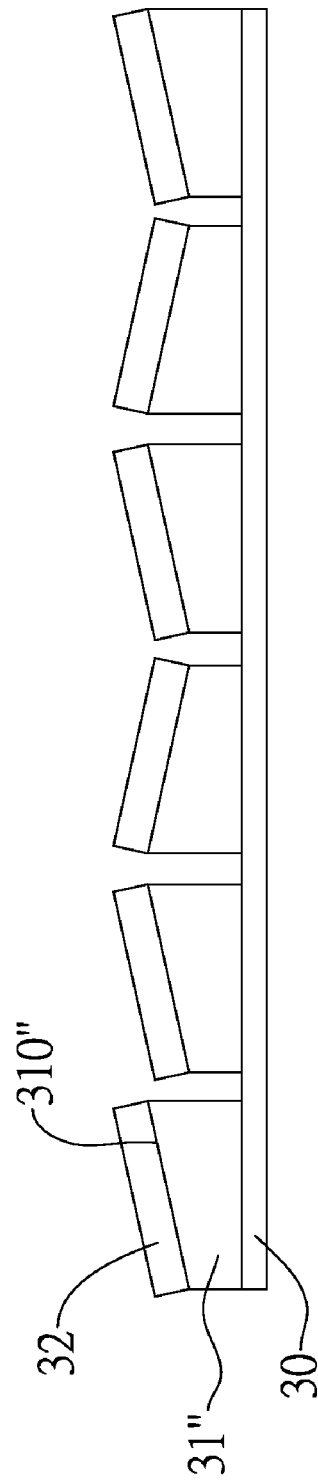

LIGHT SOURCE DEVICE

BACKGROUND OF THE INVENTION

1. Field of the Invention

The present invention relates generally to a light source device, and more particularly to a light source device without additional light control elements.

2. Description of Related Art

Along with the development of semiconductor fabrication process technologies, micro-sized luminous elements can be obtained by connecting light emitting diode (LED) dies to external pins and packaging them so as to replace conventional incandescent lamps. As the luminous elements have advantages of long life, low power consumption, high light emitting efficiency and a richer color gamut, they have been widely applied. However, as the luminous intensity of a single luminous element of an LED is not sufficient, a light source device generally comprises a plurality of LEDs so as to obtain sufficient luminous intensity. Moreover, since LEDs are directional light sources, LEDs can be obliquely arranged in a light source device, or a light control element can be selectively disposed in the light source device, so as to satisfy a user's light distribution requirement. However, on the one hand, obliquely arranged LEDs increase the mold manufacturing cost and assembly cost. On the other hand, the use of a light control element, such as a light control film, a geometric reflection screen, a deflection lens and so on, decreases the light-emitting efficiency of the light source device. As a result, the number of LEDs incorporated needs to be increased, which accordingly increases the cost of the light source device.

US patent application Publication No. 20060139933 discloses a light fixture called a luminaire with a reflector of negative focal length, wherein the luminaire screen comprises a reflector of negative focal length disposed at the top thereof and a side screen disposed at two sides thereof. Thus, upward incident light rays emitted from the light source are first reflected to the side screen by the reflector of negative focal length and then are further reflected such that a plurality of concentrated rays is formed. The emitted rays are emitted out at large angles for reducing glare, and, also, the design allows the height of the luminaire to be reduced.

As shown in FIG. 1, US patent application Publication No. 20060232976 discloses a light source device 1, which comprises a luminous element 10, a reflecting screen 11 disposed at one side of the luminous element 10, a light transmission portion 12 disposed at an opposed side of the luminous element 10, and a light diffusion portion 13 disposed between the luminous element 10 and the light transmission portion 12. Therein, the reflecting screen 11 is an arc-shaped screen and one edge of the reflecting screen 11 is connected to the light transmission portion 12. Light rays emitted from the luminous element 10 are reflected in paths denoted by 'S' via the light reflecting screen and further uniformly transmitted through the light transmission portion 12, thereby improving the light-emitting efficiency of the light source device 1 and obtaining uniformly distributed illumination.

In detail, the light diffusion portion 13 is disposed at the light emitting end of the light source device 1. The light diffusion portion 13 comprises a plurality of light diffusion zones. Each surface of the light diffusion zones has a plurality of arrays of microstructures. By controlling distribution of the plurality of arrays of microstructures, the Gaussian distribution of the luminous element 10 can be improved while collimating the scattered light beams in the range of the light transmission portion 12 and diffusing the light beams emitted from the center of the luminous element 10 to the light transmission portion 12 so that not only the luminous efficiency of the light source device is enhanced, but also the uniformity of the luminance of the light source device is improved. But such a method increases the assembly cost. Meanwhile, the use of the reflecting screen 11, light transmission portion 12 and the light diffusion portion 13 not only increases the cost of the light source device 1, but also reduces the light-emitting efficiency of the light source device 1. As shown in FIG. 2, U.S. Pat. No. 5,838,247 discloses a light source device 2, which comprises a base body 20 having a carrier surface, a plurality of luminous elements 21 disposed on the carrier surface of the base body 20, and a reflecting portion 22 disposed in the base body 20 and inclined toward the base body 20, wherein the base body 20 is substantially cup shaped, the reflecting portion 20 is disposed at the bottom of the base body 20 and is substantially conical shaped or pyramid shaped, and the luminous elements 21 are disposed at the periphery of the reflecting portion 22. By adjusting the disposing angle of the luminous elements 21 relative to the base body and the tilt angle of the reflecting portion 22 relative to the base body, light rays of the luminous elements 21 can be concentrated for transmission. However, as the reflecting portion 22 is a plane and cannot be adjusted corresponding to the light emitting angle of the luminous elements 21, light rays generated by the luminous elements 21 cannot be completely reflected by the reflecting portion. Moreover, a large number of luminous elements 21 are needed according to the tilt angle of the reflecting portion 22, thus increasing the cost and volume of the light source device 2 and decreasing the flexibility of the shape of the light source device 2.

Further, the conventional planar LED die bonding process involves the following: using SMT (Surface Mount Technology) for die identification and positioning; transmitting related information to an X-Y-Z die capturing system for die transfer and positioning, wherein the X-Y-Z die capturing system has three degrees of freedom X, Y, Z; using a CCD image identification system for die identification and positioning, wherein the dies are transferred to position for dispensing through the X-Y-Z capturing system; and finally curing the system so as to fix the LED dies to the substrate. As the capturing system only has three degrees of freedom, an LED die can only be fixed to a planar substrate, which—due to its fixed structure—cannot meet users' light distribution curve requirements.

Therefore, a need exists to find a way to overcome the above-described drawbacks of the conventional light source devices.

SUMMARY OF THE INVENTION

According to the above drawbacks, an objective of the present invention is to provide a light source device that improves the luminous effect.

Another objective of the present invention is to provide a light source device that eliminates the need of additional light control elements.

A further objective of the present invention is to provide a light source device with a reduced volume and a reduced number of elements.

In order to attain the above and other objectives, the present invention provides a light source device that comprises: a substrate having a first surface and a second surface opposed to the first surface, the first surface having a plurality of carrier planes and at least one of the carrier planes is formed at an angle relative to the first surface; and a plurality of LEDs respectively mounted to and electrically connected with the carrier planes. By electrically connecting the carrier planes to the LEDs, a predefined light distribution effect can be obtained, thereby eliminating the need for additional light control element in the prior art and enhancing the light-emitting efficiency of the light source device. Moreover, as the assembly method of the LEDs is not changed, the volume and the number of elements of the light source device can be reduced and the luminous effect of the light source device is improved.

The above-described substrate is a heat-dissipating substrate having a high thermal conductivity such as a metal substrate, a silicon substrate, a ceramic substrate or a circuit board. In one embodiment, the carrier planes may be formed at the same angle relative to the first surface. In another embodiment, the carrier planes may be formed at different angles relative to the first surface. Further, the LEDs can be LED dies of same color. Alternatively, the LEDs can be LED dies of different colors.

In addition, the carrier planes may not only be formed on the first surface but also can be formed on the second surface. As a result, the LEDs can be respectively mounted to the first and second surfaces of the substrate.

Compared with the prior art, the light source device of the present invention electrically connects LEDs to carrier planes that are disposed according to the light distribution requirement. Thus, the LEDs are directly applied in the light source device without the need of additional light control elements, thereby reducing the volume and the number of elements of the light source device and enhancing the light-emitting efficiency of the light source device.

BRIEF DESCRIPTION OF DRAWINGS

FIG. 4 is a diagram of a light source device according to another preferred embodiment of the present invention;

FIG. 5 is a diagram of a light source device according to a further preferred embodiment of the present invention;

DETAILED DESCRIPTION OF PREFERRED EMBODIMENTS

The following illustrative embodiments are provided to illustrate the disclosure of the present invention, these and other advantages and effects being apparent to those skilled in the art after reading the disclosure of this specification.

Figure 1:
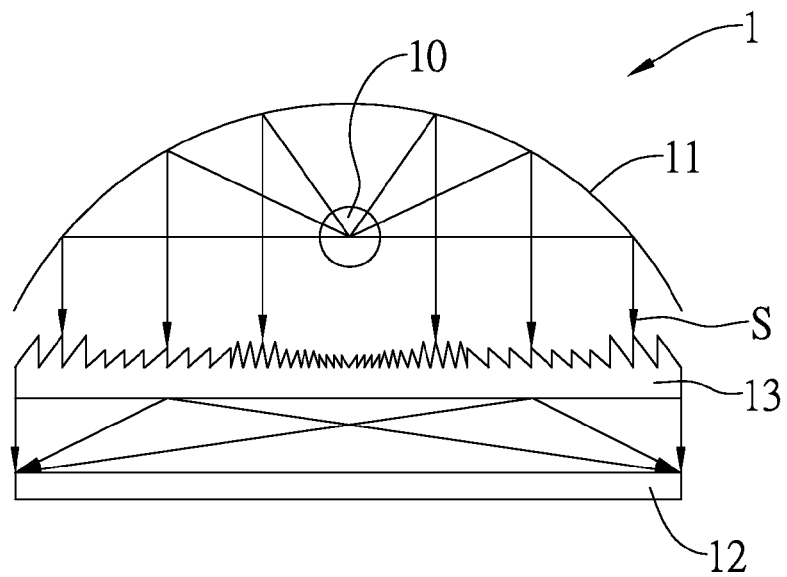
FIG. 1 is a diagram of a light source device disclosed by US patent application publication No. 20060232976.
Figure 2:
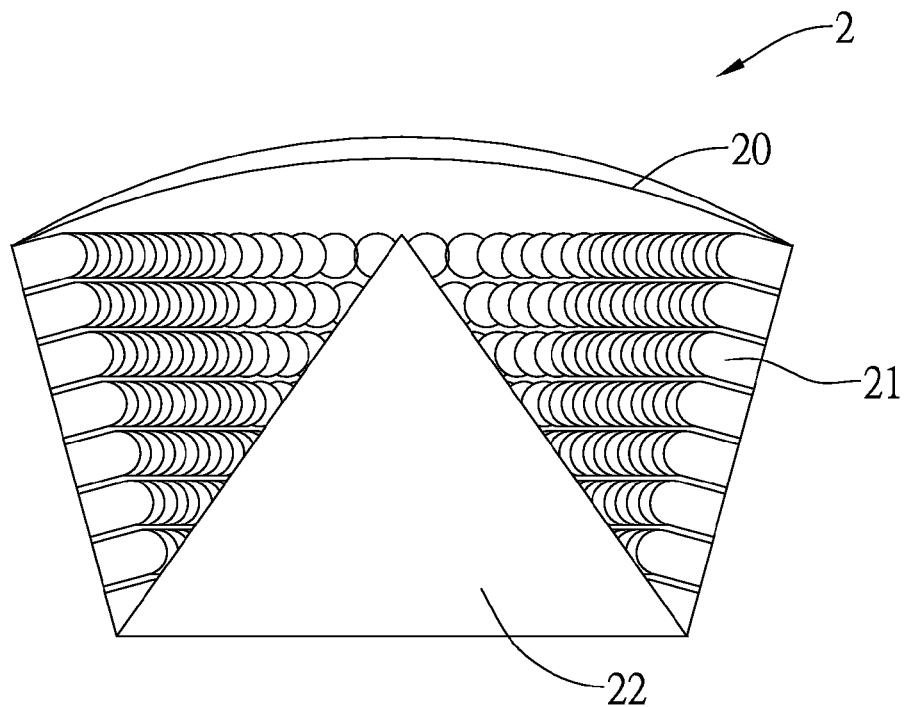
FIG. 2 is a diagram of a light source device disclosed by U.S. Pat. No. 5,838,247.
Figure 3:
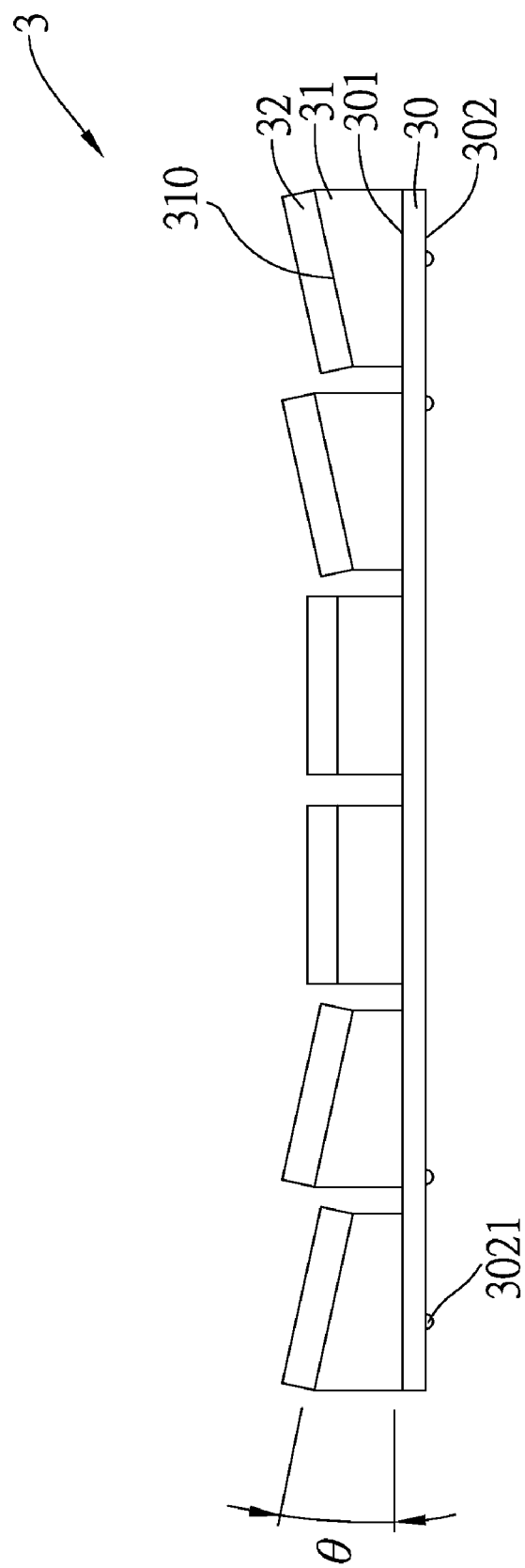
FIG. 3 is a diagram of a light source device according to a preferred embodiment of the present invention.

FIG. 3 is a diagram of a light source device according to a preferred embodiment of the present invention. As shown in FIG. 3, the light source device 3 comprises a substrate 30, a plurality of carrier planes 310 formed on the substrate 30 and a plurality of LEDs 32 respectively mounted to the carrier planes 310. In the present embodiment, the number of the carrier planes 310 and the corresponding LEDs 32 is not limited to the present embodiment and can be determined according to the practical application.

The substrate 30 has a first surface 301 and a second surface 302 opposed to the first surface 301. In the present embodiment, the plurality of carrier planes 310 is formed on the first surface 301. The substrate 30 can be a circuit board having conductive circuit so as to electrically connect the LEDs 32 with an external device or an external power source. The second surface 302 can be used for external connection. A plurality of protruding portions 31 is preformed on the first surface 301 and the carrier planes 310 are formed corresponding to the protruding portions 31. It should be noted that the substrate 30 is not limited to the circuit board of the present embodiment. Alternatively, the substrate 30 can be one of a metal substrate, a silicon substrate and a ceramic substrate.

In more detail, the first surface 301 of the substrate 30 has a conductive circuit electrically connected with the protruding portions 31; the second surface 302 has a plurality of connection points 3021 for electrically connecting the conductive circuit to an external device or external power source. Since the techniques of forming conductive circuits or connection points 3021 on the substrate 30 or electrically connecting the conductive circuit and the connection points 3021 through such methods as plated through holes are well known in the art and are not characteristic of the present invention, detailed descriptions thereof are omitted.

In addition, the substrate 30 is not limited to the circuit board of the present embodiment. The substrate 30 can also be such as a metal board or other heat-dissipating board with high thermal conductivity and suitable structural integrity. The conductive circuit and the connection points 3021 respectively on the first surface 301 and the second surface 302 are not absolutely necessary to the core of the invention. For example, the substrate 30 may only provide carrier function, and electrical portions thereof can be electrically connected with external elements through bonding wires.

The above-described protruding portions 31 are formed on the first surface 301 and have carrier planes 310 electrically connected to the first surface 301, and at least one carrier surface 310 is formed at an angle θ relative to the first surface 301 of the substrate 30. The protruding portions 31 can be formed on the first surface 301 of the substrate 30 by etching, electroplating, evaporation, mechanical processing or SMT technology. Meanwhile, the carrier planes 310 and the conductive circuit can be electrically connected together by adhesion, welding or wire bonding. The carrier planes 310 can have a plurality of connection points electrically connected to the conductive circuit and the LEDs 32. Of course, the related conductive circuit and connection points can be omitted if wire bonding is applied.

Next, the LEDs 32 are respectively mounted to the carrier planes 310 and electrically connected to the substrate 30. In the present embodiment, the LEDs 32 can be LED dies of the same color or comprise a plurality of LED dies of different colors so as to provide a monochrome light source or a mixed-color or multi-color light source, depending on the LED arrangement in the case of the latter two options. Also, a plurality of LED dies or LED chips can be mounted to the carrier planes 310.

In the present embodiment, part of the carrier planes 310 on the protruding portions 31 are formed at an angle θ relative to the substrate 30 in two opposite directions and part of the carrier planes 310 are parallel to the substrate. Thus, the LEDs 32 provide a directional light source with a predetermined focal length, which can be used in projection devices that concentrates light in a region such as flashlight. Therefore, through selection of the angle θ between carrier planes 310 and the first surface of the substrate, a predetermined light distribution is attained. Meanwhile, the present embodiment eliminates the need of additional light control elements and accordingly reduces the fabrication cost, the volume of the light source device and the number of elements. Also, reflection loss or deflection loss is avoided or reduced and the light-emitting efficiency of the light source device 3 is enhanced.

As described above, the characteristic of the present invention is design of angle θ between carrier planes 310 and the substrate for attaining a predetermined light distribution. It should be noted that the carrier planes 310 can be formed at different angles or at a single angle relative to the first surface 301 of the substrate 30 depending on the external devices to which the invention will be applied.

FIG. 4 is a light source device according to another embodiment of the present invention, wherein the elements of FIG. 4 that are the same as or similar to those of the first embodiment are denoted by the same or similar numerals. As shown in FIG. 4, part of the carrier planes 310' of a plurality of protruding portions 31' are formed at different angles corresponding to the substrate 30 in opposite directions and part of carrier planes 310' are formed parallel to the substrate 30. That is, as opposed to the light source depicted in FIG. 3 which directs light towards the center of the light source, the light source depicted in FIG. 4 directs light to the center and off to both sides of the light source for a total of three main directions. Thus, the LEDs 32 provide a directional light source with a central portion and two ends emitting light in different directions, which can be applied in projection devices that diffuse light to multiple regions such as a vehicle light.

FIG. 5 shows a light source device according to another embodiment, wherein elements of FIG. 5 that are the same as or similar to those of the above-described embodiment are denoted by the same or similar numerals. As shown in FIG. 5, carrier planes 310" of a plurality of protruding portions 31" are formed at angles relative to the substrate 30 in two different directions such that the LEDs 32 can provide a directional light source with a central portion and such that one end thereof emits focused light and the other end thereof emits diffused light. Thus, the light source device can be applied in projection devices that focus light in multiple regions such as neon light.

Figure 6:
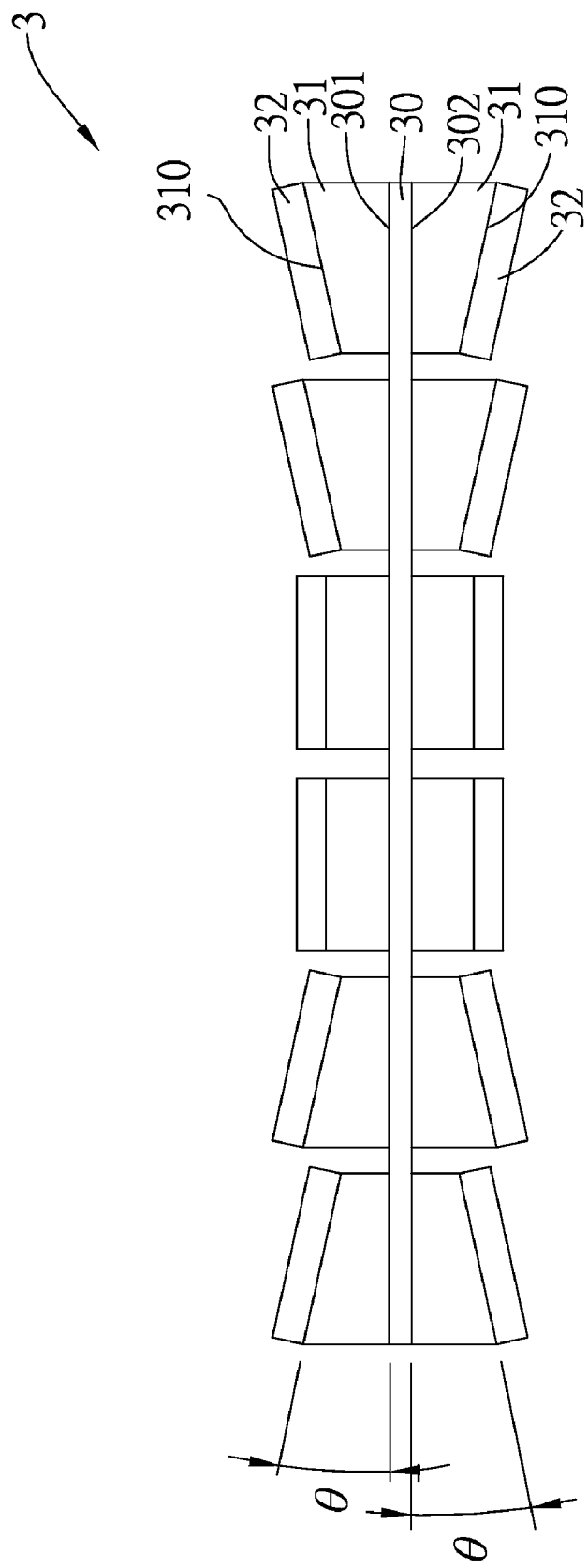
FIG. 6 is a diagram of a light source device according to a further preferred embodiment of the present invention.

FIG. 6 shows a light source device according to another embodiment of the present invention, wherein a light source is formed on both main sides of the substrate 30. As shown in FIG. 6, the protruding portions 31 are also formed on the second surface 302 of the substrate 30, and the protruding portions 31 on the second surface 302 correspond in arrangement to the protruding portions 31 on the first surface 301. The protruding portions 31 can also be formed asymmetrically on the two main sides of the substrate 30. The connection method and characteristics of the protruding portions 31 on the second surface 302 are the same as those on the first surface 301. Thus, the LEDs 32 on two sides can emit light in predetermined directions.

In the above-described embodiments, the plurality of carrier planes is formed at different angles relative to the substrate. However, the plurality of carrier planes may also be formed at the same angle relative to the substrate.

Figure 7:
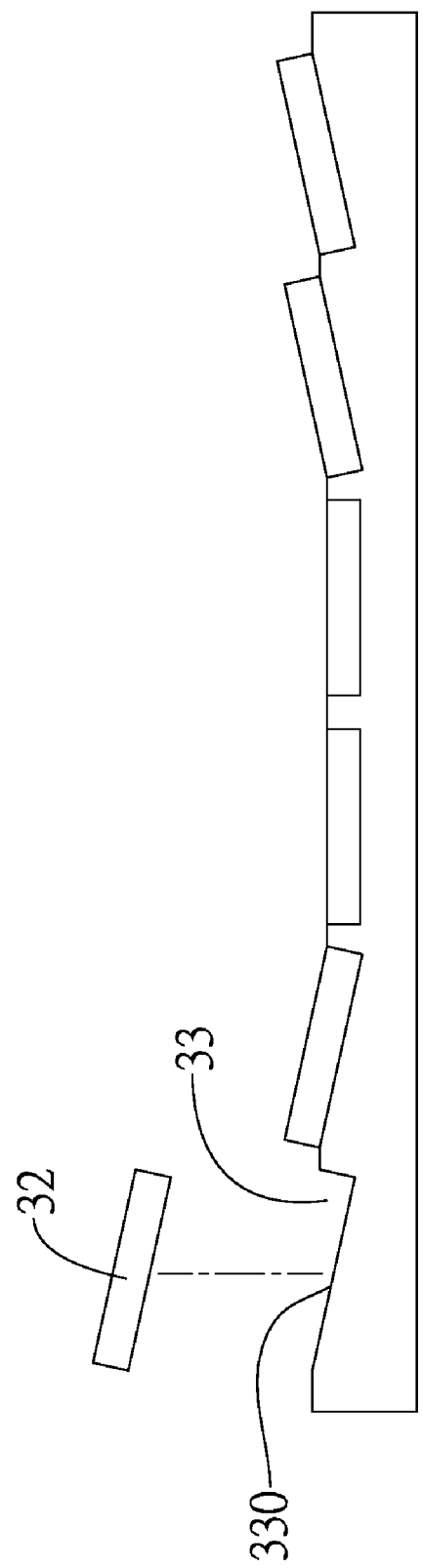
FIG. 7 is a diagram of a light source device according to a further preferred embodiment of the present invention.

It should be noted that the carrier planes in the above-described light source devices are not limited to the protruding portions. Alternatively, concave portions can be formed on the substrate. As shown in FIG. 7, a plurality of concave portions 33 is formed on the substrate by etching, mold ejection, mold pressing or other process so as to obtain the carrier planes 330. The LEDs 32 are mounted to the carrier planes 330 so as to form a light source device that emits light in a predetermined direction.

In the above description, the structural design of the light source devices is described in detail and the electrical connection between the LEDs and carrier planes is also exemplified. As the related fabrication methods such as the semiconductor fabrication technique and ejection molding are not characteristic of the present invention and also the electrical connection techniques such as flip chip and wire bonding are well known in the prior art, detailed descriptions thereof are omitted.

According to the light source device of the present invention, LEDs are electrically connected to a plurality of carrier planes and the carrier planes are disposed at suitable angles relative to the substrate according to the predetermined light distribution requirement. As a result, the LEDs are directly applied in the light source device without the need of additional light control elements, thereby reducing the volume and the number of elements of the light source device and enhancing the light-emitting efficiency of the light source device.

The above-described descriptions of the detailed embodiments are provided only to illustrate the preferred implementation according to the present invention, and are not intended to limit the scope of the present invention. Accordingly, various modifications and variations completed by those with ordinary skill in the art should be construed to fall within the scope of present invention as defined by the appended claims.

What is claimed is:

1. A light source device, comprising:
 a substrate having a first surface and a second surface opposed to the first surface, the first surface having a plurality of carrier planes, with at least one of the carrier planes being formed at an angle relative to the first surface, wherein each of the carrier planes has a height independently varying with respect with the first surface; and
 a plurality of LEDs respectively mounted to and electrically connected with the carrier planes.

2. The light source device of claim 1, wherein the carrier planes may be formed at the same angle relative to the first surface.

3. The light source device of claim 1, wherein the carrier planes may be formed at different angles relative to the first surface respectively.

4. The light source device of claim 1, wherein the first surface of the substrate has a plurality of protruding portions and the carrier planes are formed respectively corresponding to the protruding portions.

5. The light source device of claim 1, wherein the first surface of the substrate has a plurality of concave portions and the carrier planes are formed respectively corresponding to the concave portions.

6. The light source device of claim 1, wherein the LEDs are LED dies of the same color.

7. The light source device of claim 1, wherein the LEDs are LED dies of different colors.

8. The light source device of claim 1, wherein the carrier planes are mounted with a plurality of LEDs.

9. The light source device of claim 1, wherein each of the LEDs is one of an LED chip and an LED die.

10. The light source device of claim 1, wherein the substrate is one of a metal substrate, a silicon substrate, a ceramic substrate and a circuit board.

11. The light source device of claim 1, wherein the plurality of cater planes comprises cater planes formed on the second surface.

12. The light source device of claim 11, wherein the first and second surfaces of the substrate have a plurality of protruding portions and the carrier planes are formed corresponding to the protruding portions.

13. The light source device of claim 11, wherein the first and second surfaces of the substrate have a plurality of concave portions and the carrier planes are formed corresponding to the concave portions.

* * * * *